(12) United States Patent
Feldman et al.

(10) Patent No.: US 8,953,087 B2
(45) Date of Patent: Feb. 10, 2015

(54) CAMERA SYSTEM AND ASSOCIATED METHODS

(75) Inventors: Michael R. Feldman, Huntersville, NC (US); James E. Morris, Lake Wylie, SC (US); Robert D. TeKolste, Charlotte, NC (US)

(73) Assignee: FLIR Systems Trading Belgium BVBA, Meer (BE)

(*) Notice: Subject to any disclaimer, the term of this patent is extended or adjusted under 35 U.S.C. 154(b) by 0 days.

(21) Appl. No.: 12/805,617

(22) Filed: Aug. 10, 2010

(65) Prior Publication Data

US 2010/0321564 A1 Dec. 23, 2010

Related U.S. Application Data

(63) Continuation of application No. PCT/US2007/016156, filed on Jul. 17, 2007, and a continuation-in-part of application No. 11/487,580, filed on Jul. 17, 2006, now Pat. No. 8,049,806, which (Continued)

(51) Int. Cl.
*H04N 5/225* (2006.01)
*G02B 9/12* (2006.01)
(Continued)

(52) U.S. Cl.
CPC ............. *G02B 9/12* (2013.01); *G02B 13/003* (2013.01); *G02B 13/0035* (2013.01); *G02B 13/006* (2013.01); *G02B 13/0085* (2013.01);
(Continued)

(58) Field of Classification Search
CPC . H04N 5/2253; H04N 5/2254; H04N 5/2251; H04N 5/2257; H04N 5/2252

USPC .................. 348/374, 340; 257/432; 385/14
See application file for complete search history.

(56) References Cited

U.S. PATENT DOCUMENTS 4,479,143 A 10/1984 Watanabe et al.
4,804,249 A 2/1989 Reynolds et al.
(Continued)

FOREIGN PATENT DOCUMENTS

EP 1067779 A2 1/2001
EP 1 215 729 A2 6/2002
(Continued)

OTHER PUBLICATIONS

European Search Report in EP 11153126.5-1234, dated Mar. 24, 2011 (Feldman, et al.).
(Continued)

*Primary Examiner* — Twyler Haskins
*Assistant Examiner* — Fayez Bhuiyan
(74) *Attorney, Agent, or Firm* — Lee & Morse, P.C.

(57) ABSTRACT

A camera system may include an optics stack including two substrates, the optics stack forming an imaging system, each substrate having two surfaces that are parallel to each other and perpendicular to an optical axis of the imaging system, the optics stack including a securing region on opposing surfaces of the two substrates, the two substrates being secured together on a wafer level at their respective securing regions, at least one of the surfaces of the two substrates including a refractive surface of the imaging system, a detector substrate having an active area and a cover structure protecting at least the active area of the detector substrate, the optics stack being secured to an upper surface of the cover structure.

21 Claims, 13 Drawing Sheets

Related U.S. Application Data is a continuation-in-part of application No. 10/949,807, filed on Sep. 27, 2004, now Pat. No. 7,773,143.

(60) Provisional application No. 60/855,365, filed on Oct. 31, 2006, provisional application No. 60/560,273, filed on Apr. 8, 2004.

(51) Int. Cl.
*G02B 13/00* (2006.01)
*H01L 27/146* (2006.01)

(52) U.S. Cl.
CPC .... *H01L27/14625* (2013.01); *H01L 27/14685* (2013.01); *H04N 5/2254* (2013.01); *H04N 5/2257* (2013.01)
USPC .......................................... 348/340; 348/374

(56) References Cited

U.S. PATENT DOCUMENTS

| | | | |
|---|---|---|---|
| 5,274,456 A | 12/1993 | Izumi et al. | |
| 5,355,222 A | 10/1994 | Heller et al. | |
| 5,451,766 A | 9/1995 | Ven Berkel | |
| 5,568,197 A | 10/1996 | Hamano | |
| 5,671,073 A | 9/1997 | Psaltis et al. | |
| 5,748,371 A | 5/1998 | Cathey, Jr. et al. | |
| 5,757,423 A | 5/1998 | Tanaka et al. | |
| 5,760,832 A | 6/1998 | Yamanaka et al. | |
| 6,069,738 A | 5/2000 | Cathey, Jr. et al. | |
| 6,108,036 A | 8/2000 | Harada et al. | |
| 6,137,535 A | 10/2000 | Meyers | |
| 6,285,064 B1 | 9/2001 | Foster | |
| 6,346,969 B1 | 2/2002 | Kwon | |
| 6,366,319 B1 | 4/2002 | Bills | |
| 6,414,296 B1 | 7/2002 | Edwards | |
| 6,417,950 B1 | 7/2002 | Cathey, Jr. et al. | |
| 6,535,332 B1 | 3/2003 | Nakano et al. | |
| 6,541,284 B2 | 4/2003 | Lam | |
| 6,611,289 B1 | 8/2003 | Yu et al. | |
| 6,632,701 B2 | 10/2003 | Merrill | |
| 6,635,941 B2 | 10/2003 | Suda | |
| 6,795,253 B2 | 9/2004 | Shinohara | |
| 6,859,229 B1* | 2/2005 | Suda | 348/273 |
| 6,882,364 B1 | 4/2005 | Inuiya et al. | |
| 6,954,311 B2 | 10/2005 | Amanai | |
| 7,003,177 B1 | 2/2006 | Mendlovic et al. | |
| 7,009,652 B1 | 3/2006 | Tanida et al. | |
| 7,034,866 B1 | 4/2006 | Colmenarez et al. | |
| 7,133,076 B1* | 11/2006 | Campbell | 348/340 |
| 7,196,855 B2 | 3/2007 | Yamaguchi | |
| 7,199,348 B2 | 4/2007 | Olsen et al. | |
| 7,453,510 B2 | 11/2008 | Kolehmainen et al. | |
| 7,499,093 B2 | 3/2009 | Campbell | |
| 7,511,749 B2 | 3/2009 | Ghuhlk et al. | |
| 7,564,019 B2 | 7/2009 | Olsen et al. | |
| 7,566,855 B2 | 7/2009 | Olsen et al. | |
| 7,591,780 B2* | 9/2009 | Jacobsen et al. | 600/109 |
| 7,616,250 B2* | 11/2009 | Watanabe et al. | 348/340 |
| 7,710,667 B2* | 5/2010 | Oliver et al. | 359/776 |
| 7,961,989 B2* | 6/2011 | Kathman et al. | 385/14 |
| 2002/0006687 A1 | 1/2002 | Lam | |
| 2002/0089596 A1 | 7/2002 | Suda | |
| 2002/0122124 A1 | 9/2002 | Suda | |
| 2002/0163054 A1 | 11/2002 | Suda | |
| 2002/0163582 A1 | 11/2002 | Gruber et al. | |
| 2002/0176148 A1* | 11/2002 | Onuki et al. | 359/253 |
| 2002/0181123 A1 | 12/2002 | Han | |
| 2002/0181126 A1 | 12/2002 | Nishioka | |
| 2004/0012698 A1 | 1/2004 | Suda et al. | |
| 2004/0047274 A1 | 3/2004 | Amanai | |
| 2004/0095502 A1 | 5/2004 | Losehand et al. | |
| 2005/0073603 A1 | 4/2005 | Feldman et al. | |
| 2005/0104991 A1 | 5/2005 | Hoshino et al. | |
| 2005/0128335 A1 | 6/2005 | Kolehmainen et al. | |
| 2005/0242410 A1 | 11/2005 | Groot et al. | |
| 2005/0248680 A1 | 11/2005 | Humpston | |
| 2005/0258350 A1 | 11/2005 | Van Arendonk | |
| 2005/0285016 A1 | 12/2005 | Kong et al. | |
| 2006/0023108 A1* | 2/2006 | Watanabe et al. | 348/335 |
| 2006/0043262 A1 | 3/2006 | Akram | |
| 2006/0044450 A1* | 3/2006 | Wolterink et al. | 348/340 |

FOREIGN PATENT DOCUMENTS

| | | |
|---|---|---|
| EP | 1239519 A2 | 9/2002 |
| EP | 1244151 A2 | 9/2002 |
| JP | 06-269010 A | 9/1994 |
| JP | 2002-135796 A | 5/2002 |
| JP | 2003-289456 A | 10/2003 |
| JP | 2003-322792 A | 11/2003 |
| JP | 2004-004566 A | 1/2004 |
| JP | 2004-088713 A | 3/2004 |
| JP | 2004-302095 A | 10/2004 |
| JP | 2005-198103 A | 7/2005 |
| JP | 2005-539276 A | 9/2005 |
| JP | 2006-080597 A | 3/2006 |
| JP | 2006-081043 A | 3/2006 |
| WO | WO 00/52511 A1 | 9/2000 |
| WO | WO 01/91193 A2 | 11/2001 |
| WO | WO 01/99431 A1 | 12/2001 |
| WO | WO 02/077695 A1 | 10/2002 |
| WO | WO 03/024090 | 3/2003 |
| WO | WO 2004/027880 A2 | 4/2004 |
| WO | WO 2005/041561 | 5/2005 |

OTHER PUBLICATIONS

Tanida, et al., "Color Imaging with an Integrated Compound Imaging System", Optics Express, 11(18):2109-2117 (Sep. 8, 2003).

Kubala, et al. "Reducing Complexity in Computational Imaging System", Optical Society of America, © 2003.

Mait, et al. Evolutionary Paths in Imaging and Recent Trends, Optics Express, 11(18):2093-2101 (Sep. 8, 2003).

Potuluri, et al. "High Depth of Field Microscopic Imaging Using an Inteferometric Camera", Optics Express, 8(11):624-630 (May 21, 2001).

Tanida, et al. Thin Observation Module by Bound Optics (TOMBO): Concept and Experimental Verification, Applied Optics, 40(11):1806-1813 (Apr. 10, 2001).

Dowski, Jr., et al., [I] "Aberration Invariant Optical/Digital Incoherent Systems," Imaging Systems Laboratory, Dept. of Electrical Engineering, U.Colorado, Boulder, CO, Optical Review, 3(6A):429-432, (1996).

Dowski, Jr., et al., [II] "Aberration Invariant Optical/Digital Incoherent Optical Systems", Imaging Systems Laboratory, Dept. of Electrical Engineering, U.Colorado, Boulder, CO, (3 pages) (1996).

Dowski, Jr., et al., [III] "Wavefront Coding: A Modern Method of Achieving High Performance and/or Low Cost Imaging Systems" (9 pages), SPIE, (1999).

Japanese Office action for JP 2009-520799 dated Jul. 10, 2012. Michael R. Feldman, et al.

Extended European Search Report issued Jul. 4, 2012 for EP 07796897.2. (Feldman, et al.).

Japanese Office action for JP 2011-26844 dated Aug. 6, 2013. Michael R. Feldman, et al.

Japanese Office action for JP 2011-26844 dated Jun. 3, 2014. Michael R. Feldman, et al.

\* cited by examiner

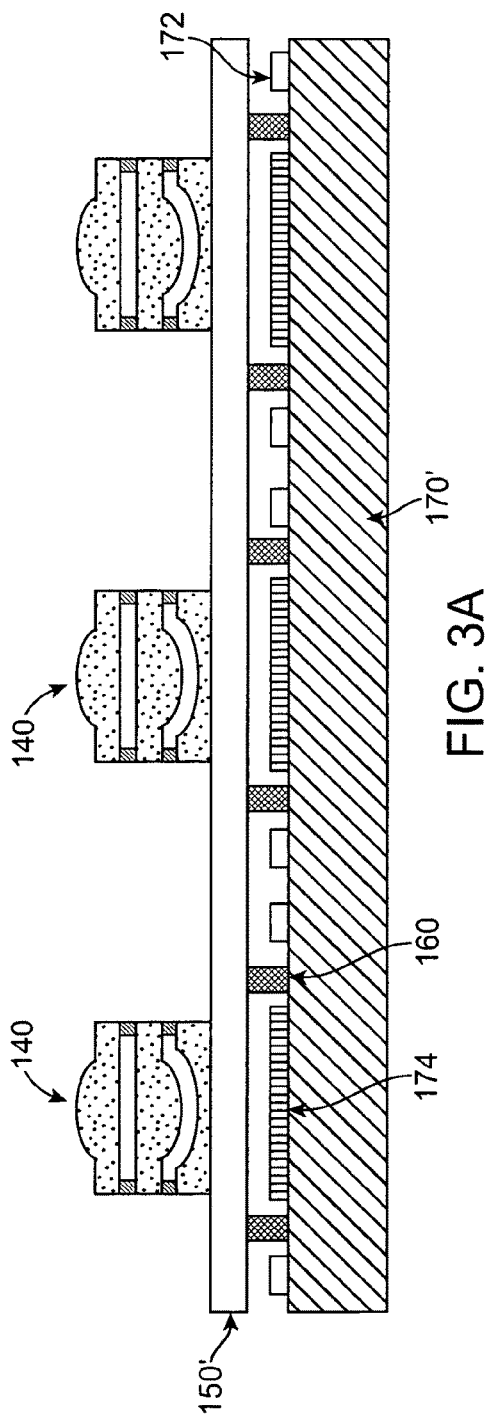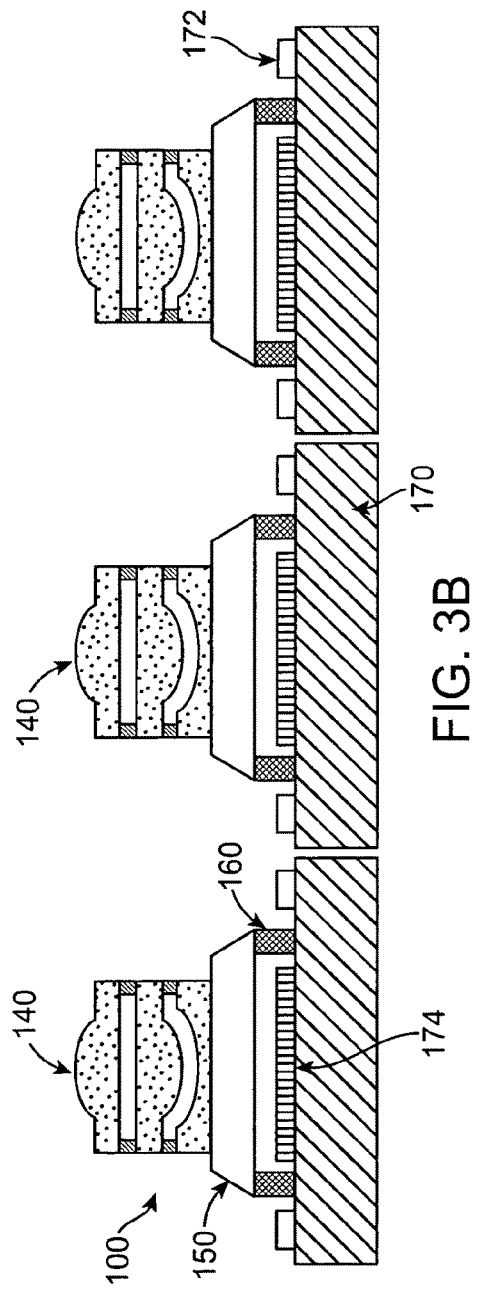

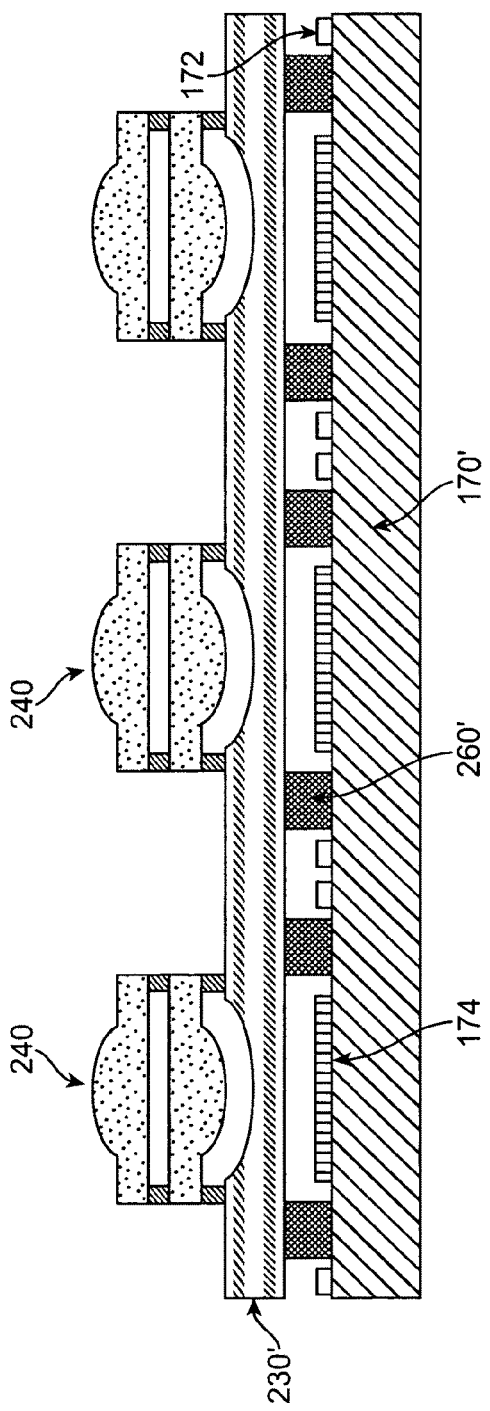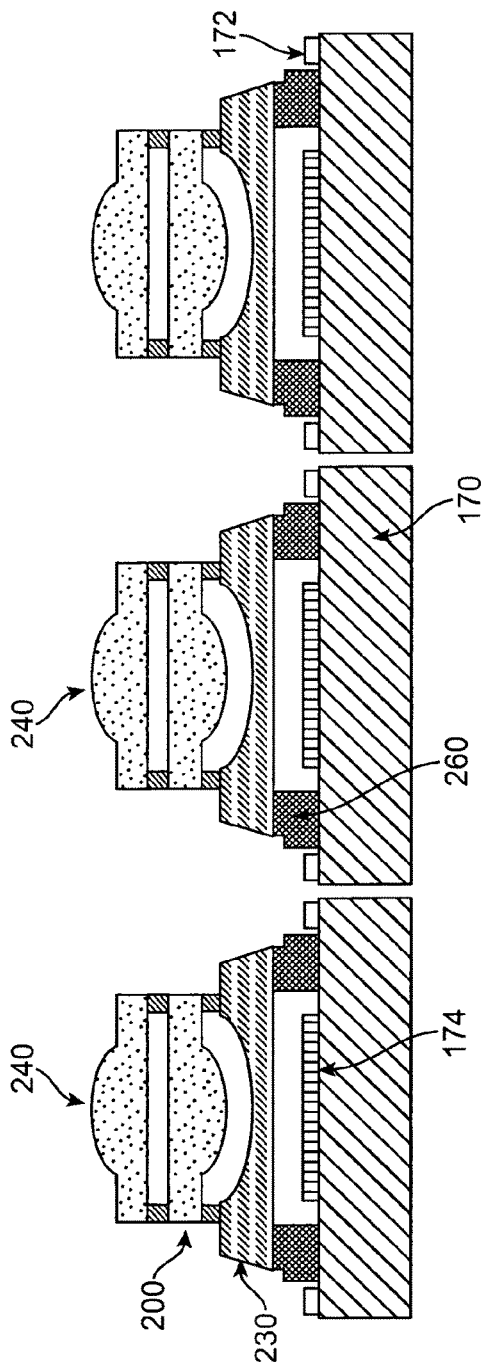

CAMERA SYSTEM AND ASSOCIATED METHODS

CROSS-REFERENCE TO RELATED APPLICATIONS

The present application is a continuation of PCT/US2007/016156, filed Jul. 17, 2007, which is based on provisional application Ser. No. 60/855,365, filed Oct. 31, 2006, and is a continuation-in-part of application Ser. No. 11/487,580, filed Jul. 17, 2006 now U.S. Pat. No. 8,049,806, which is a continuation-in-part of Ser. No. 10/949,807, filed Sep. 27, 2004 (now U.S. Pat. No. 7,773,143), which is based on provisional Ser. No. 60/560,273, filed Apr. 8, 2004, the entire contents of all of which is hereby incorporated by reference.

BACKGROUND OF THE INVENTION

1. Field of the Invention

Embodiments of the present invention are directed to a camera system and a method of mass producing a camera system.

2. Description of Related Art

As camera systems become more widely used in increasingly smaller devices, demand for smaller, lighter, thinner, better and cheaper camera systems increases. However, current solutions may not optimally and/or simultaneously satisfy all design parameters.

SUMMARY OF THE INVENTION

Embodiments of the present invention are therefore directed to a camera system and associated methods, which substantially overcome one or more of the problems due to the limitations and disadvantages of the related art.

It is therefore a feature of an embodiment of the present invention to provide a camera system and associated methods in which a lens system for imaging an object forms a vertical optics stack that are singulated before being secured to a detector substrate.

It is another feature of an embodiment of the present invention to provide a camera system and associated methods having an optics stack secured directly on a cover structure for a detector.

It is another feature of an embodiment of the present invention to provide a camera system and associated methods in which a plurality of optics stacks are secured to a wafer containing a plurality of detectors.

It is another feature of an embodiment of the present invention to provide a camera system and associated methods in which a cover structure of the detector extends beyond the optics stack.

At least one of the above and other features and advantages of the present invention may be realized by providing a camera system including an optics stack including two substrates, the optics stack forming an imaging system, each substrate having two surfaces that are parallel to each other and perpendicular to an optical axis of the imaging system, the optics stack including a securing region on opposing surfaces of the two substrates, the two substrates being secured together on a wafer level at their respective securing regions, at least one of the surfaces of the two substrates including a refractive surface of the imaging system, a detector substrate having an active area and a cover structure protecting at least the active area of the detector substrate, the optics stack being secured to an upper surface of the cover structure.

A diameter of the refractive surface in the optics stack may be smaller than a diagonal of the active area corresponding to the imaging system.

The camera system may include conductive features on a bottom surface of the detector substrate adapted to surface mount the detector substrate.

At least one substrate in the optics stack has a smaller surface area than an upper surface area of the cover structure.

The two substrates and the cover structure may be secured at a wafer level.

The two substrates may be co-extensive.

The cover structure may include a final optical element.

The camera system may include a final optical element between the optics stack and the cover structure.

The cover structure and the detector substrate may be secured on a wafer level.

The cover structure and the optics stack are secured on a wafer level.

The camera system may include a plurality of sub-cameras, each having a corresponding refractive surface on a same surface of the optics stack.

The camera system may include a spacer structure between the securing regions of opposing surfaces. The spacer structure may be an adhesive.

Electrical interconnections may wrap around edges of the detector substrate from the active area to the conductive features.

The camera system may include a circuit board on which the detector substrate is surface mounted, the conductive features being soldered to the circuit board.

The conductive features may be solder.

The two surfaces may include planar regions.

The securing regions may be planar.

At least one of the above and other features and advantages of the present invention may be realized by providing a camera system including an optics stack including a first substrate having a first refractive element, a second substrate having a second refractive element and a first separation between adjacent substrates, the first and second substrates being secured on a wafer level, a detector substrate having an active area, and a second separation between the optics stack and the active area, the second separation being smaller than the first separation.

The optics stack may include a third substrate adjacent the detector substrate.

The first separation may be between the first and second substrates, or between the second and third substrates.

A diameter of a refractive element closest to the active area may be larger than diameter of other refractive elements in the optics stack.

The camera system may include a cover structure covering the active area, the optics stack being mounted directly on the cover structure.

The camera system may include a plurality of sub-cameras, each having a corresponding a first refractive element of on a first surface of the first substrate and a second refractive element on a first surface of the second substrate.

At least one of the above and other features and advantages of the present invention may be realized by providing a camera system including a first substrate having a first refractive element having a first diameter, a first baffle having a first baffle opening, a second substrate having a second refractive element having a second diameter, the second diameter being larger than the first diameter, a detector substrate having an active area, the detector substrate being closer to the second substrate than to the first substrate, at least two of the first, second and detector substrates being secured on a wafer level, and a second baffle between the first baffle and the detector substrate, the second baffle having a second baffle opening that is larger than the first baffle opening.

The first baffle may be on the first substrate. The first baffle may be on a first surface of the first substrate further from the detector substrate.

At least one of the above and other features and advantages of the present invention may be realized by providing a method of making a camera system, the method including aligning an optics stack wafer including first and second wafers, the optics stack wafer forming a plurality of imaging systems, securing the optics stack wafer at regions on opposing surfaces of the first and second wafers, the opposing surfaces being parallel to one another and perpendicular to an optical axis of the imaging system, separating the secured first and second wafers through the opposing surfaces, thereby forming a plurality of optics stacks, each optics stack including an imaging system, and securing an optics stack to a detector substrate having an active area, a diameter of the refractive surface being smaller than a diagonal of the active area.

Securing the optics stack may include securing the optics stack to a detector substrate when the detector substrate is part of a detector wafer.

The method may include securing a cover structure wafer to the detector wafer.

The may include separating the secured cover structure wafer, detector wafer and optics stacks in the through the opposing surfaces to form a plurality of camera systems, each camera system including a cover structure, a detector and an optics stack.

At least one substrate in the optics stack has a smaller surface area than an upper surface area of the cover structure.

The method may include determining whether an optics stack is acceptable, determining whether the active area is acceptable, and only securing acceptable optics stacks to acceptable active areas.

The method may include providing a spacer structure between securing regions on opposing parallel surfaces.

The spacer structure may be an adhesive, and may be formed by punching out optical paths in a layer of the adhesive.

At least one of the above and other features and advantages of the present invention may be realized by providing a method A method of making a camera system, including aligning an optics stack wafer including first and second wafers, the optics stack wafer forming a plurality of imaging systems, securing the optics stack wafer at regions on opposing surfaces of the first and second wafers, the opposing surfaces being parallel to one another and perpendicular to an optical axis of the imaging system, separating secured first and second wafers through the parallel surfaces, thereby forming a plurality of optics stacks, each optics stack including an imaging system, securing an optics stack to a detector substrate having an active area, and forming conductive features on a bottom surface of the detector substrate adapted to surface mount the camera system.

The method may further include forming electrical interconnections wrapping around edges of the detector substrate from the active area to the conductive features.

The method may further include providing a spacer structure between securing regions on opposing parallel surfaces.

The spacer structure may be an adhesive. The method may include punching out optical paths in a layer of the adhesive.

The method may include providing a circuit board, and reflowing solder to secure the conductive features and the circuit board.

The conductive features may be solder.

BRIEF DESCRIPTION OF THE DRAWINGS

The above and other features and advantages of the present invention will become readily apparent to those of skill in the art by describing in detail embodiments thereof with reference to the attached drawings, in which:

FIGS. 3A and 3B illustrate cross-sectional views in stages of a method of manufacturing the camera system of FIG. 1D in accordance with an embodiment of the present invention;

FIGS. 6A and 6B illustrate cross-sectional views in stages of a method of manufacturing a camera system including the elements shown in FIGS. 4B and 5 in accordance with another embodiment of the present invention;

DETAILED DESCRIPTION OF THE INVENTION

Figure 1A:
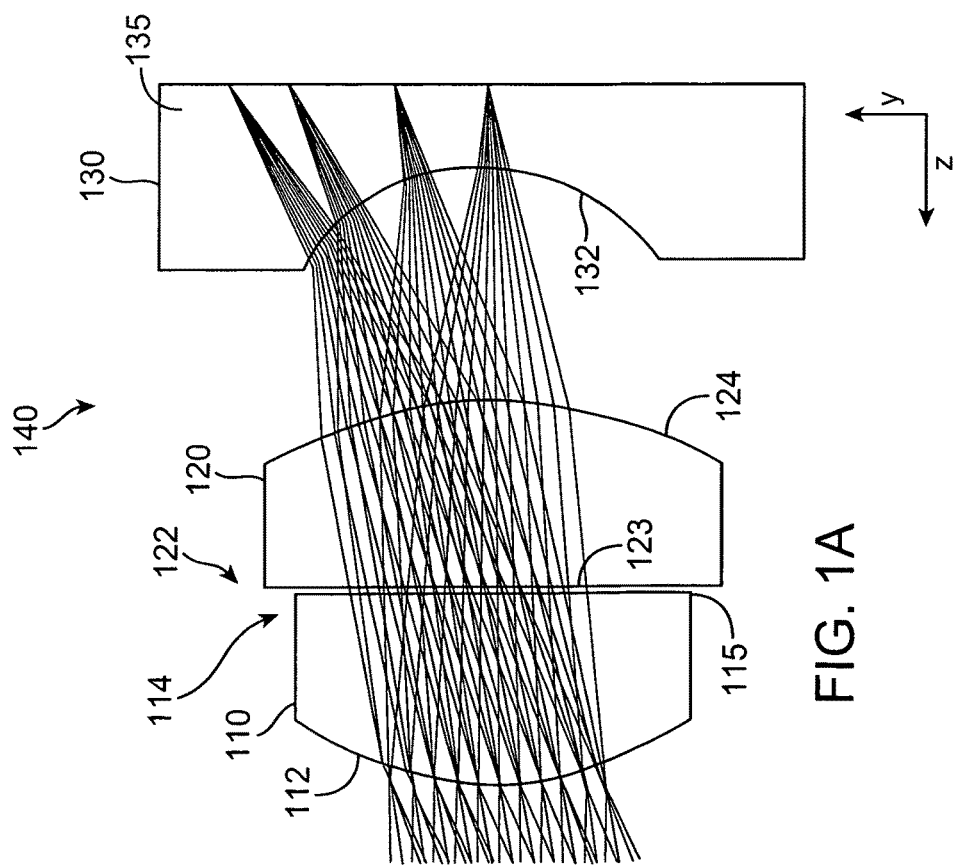
FIG. 1A illustrates a schematic side view of a camera system according to an embodiment of the present invention.

Embodiments of the present invention will now be described more fully hereinafter with reference to the accompanying drawings. The invention may, however, be embodied in different forms and should not be construed as limited to the embodiments set forth herein. Rather, these embodiments are provided so that this disclosure will be thorough and complete, and will fully convey the concept of the invention to those skilled in the art.

In the drawings, the thickness of layers and regions may be exaggerated for clarity. It will also be understood that when a layer is referred to as being "on" another layer or substrate, it may be directly on the other layer or substrate, or intervening layers may also be present. Further, it will be understood that when a layer is referred to as being "under" another layer, it may be directly under, or one or more intervening layers may also be present. In addition, it will also be understood that when a layer is referred to as being "between" two layers, it may be the only layer between the two layers, or one or more intervening layers may also be present. Like numbers refer to like elements throughout. As used herein, the term "wafer" is to mean any substrate on which a plurality of components are formed on a planar surface which are to be separated through the planar surface prior to final use. Further, as used herein, the term "camera system" is to mean any system including an optical imaging system relaying optical signals to a detector system, e.g. an image capture system, which outputs information, e.g., an image.

In accordance with embodiments of the present invention, a camera system utilizing lenses, e.g., lenses having diameters smaller than a diagonal of an active area of a detector, may include a optics stack having at least two substrates secured on a wafer level. The optics stack may include an optical imaging system. The optics stack may be secured directly to a cover structure protecting the detector, or the cover structure may be part of the optics stack. The cover structure may extend beyond the optics stack.

Figure 1B:
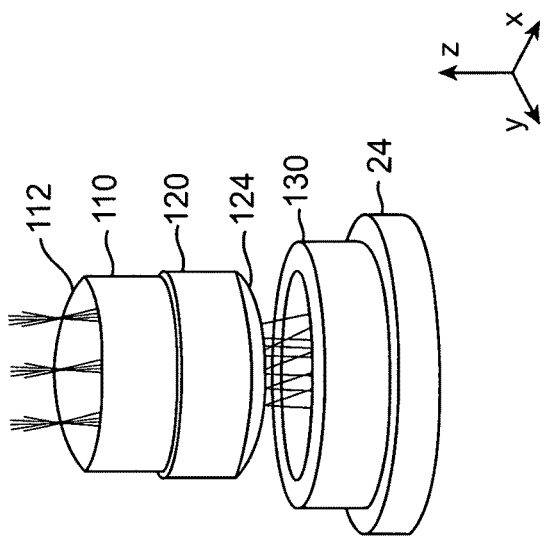
FIG. 1B illustrates a schematic perspective view of the camera system of FIG. 1A.
Figure 1C:
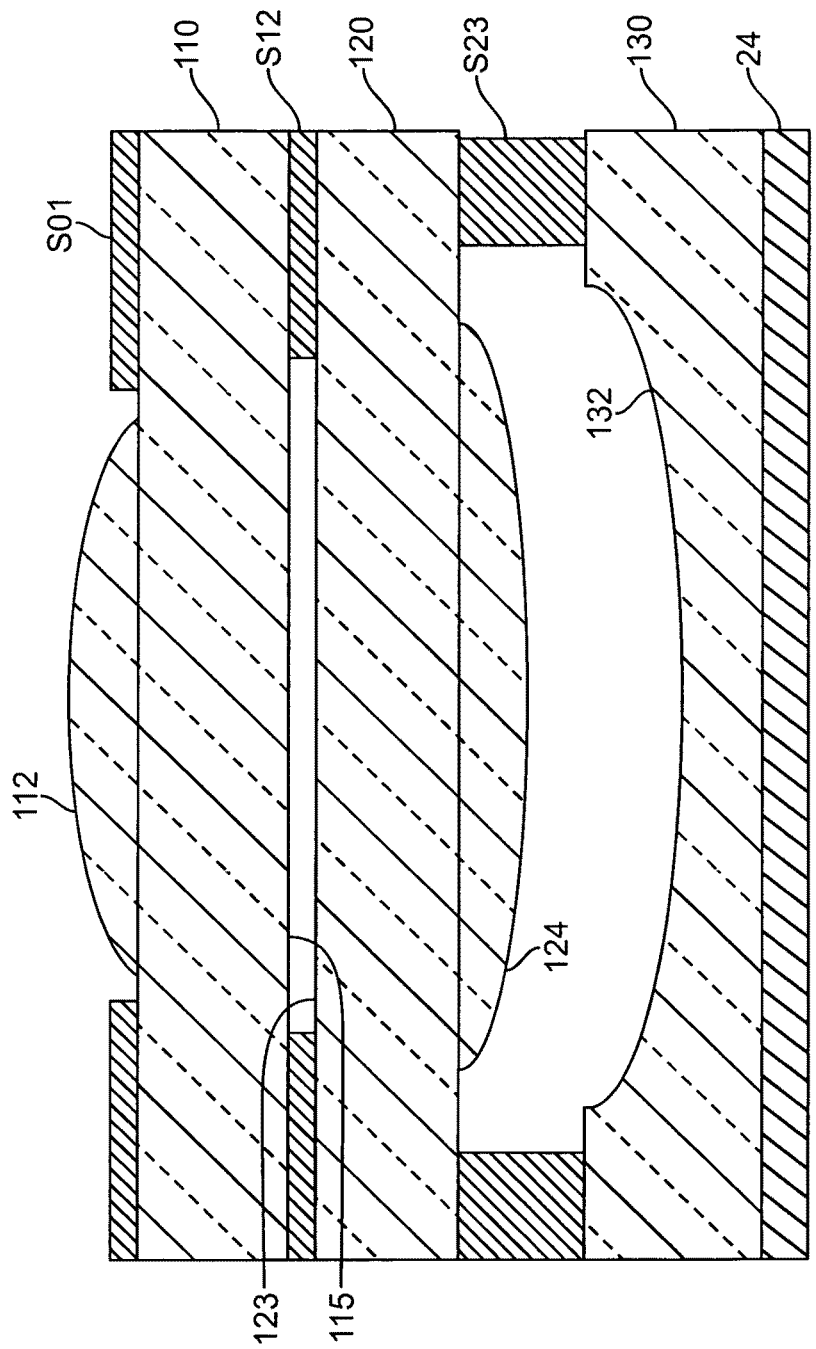
FIG. 1C illustrates a cross-sectional view of the camera system of FIG. 1A.

A camera system in accordance with an embodiment of the present invention is shown in FIGS. 1A to 1C. In FIGS. 1A to 1C, a single imaging system may be used for all colors, and a color filter array may be provided directly on the detector array 24. Of course, this imaging system may be provided in any number, e.g., three or four, as discussed below, forming a plurality of sub-cameras for each camera, and a design and/or location of color filters of the color filter array may be suitably varied.

In FIGS. 1A and 1B, different light paths correspond to different field points from the object. The imaging system may be realized in an optics stack 140 including a first substrate 110, a second substrate 120, and a third substrate 130.

A first surface of the first substrate 110 may have a first refractive surface 112, which may assist in imaging the light input thereto, e.g., may affect a focal length of the imaging system and/or may correct for aberrations. A second surface 114 of the first substrate 110 may be planar, and may include an infrared filter 115 thereon. This arrangement may be suitable varied, and the infrared filter 115 may be at any of the surfaces.

A first surface 122 of the second substrate 120 may have a diffractive element 123 thereon, which may further assist in imaging the light. A second surface of the second substrate 120 may have a second refractive surface 124, which may further assist in imaging the light.

A first surface of a third substrate 130 may have a third refractive surface 132. The third refractive surface 132 may flatten the field of the image, so that all image points may be imaged at the same plane 135 to be imaged onto a detector array 24, shown in FIG. 1B.

As shown in FIGS. 1A and 1B, the first refractive surface 112 and second refractive surface 124 may be convex, and the third refractive surface may be concave. Of course, more complex aspheric refractive surfaces, e.g., refractive surfaces including at least one concave portion and at least one convex portion, as will be discussed later, may be employed in accordance with a particular design.

A camera using sensors as the imaging media, unlike a camera using film, may have an optical element placed right against the image plane. As shown in FIGS. 1B and 1C, the final substrate, here the third substrate 130, here including the third refractive surface 132, may be secured directly to the detector array 24. Various configurations for securing the optics stack 140 and the detector array will be discussed in detail below. If the detector array 24 includes a cover plate, the third substrate 130 may be bonded to the cover plate. If the detector array does not have a cover plate, the third substrate 130 may be secured to cover and surround microlenses associated with the detector array, and may serve as the cover plate to seal the detector array from environmental factors.

This configuration may eliminate a need for active focus adjustment. Additional optical elements may be used to compensate for deviation from a desired focal length and/or chromatic aberrations.

As shown in more detail in the cross-sectional view of FIG. 1C, the substrates 110, 120 and 130 may have opposing planar regions perpendicular to an optical axis of the imaging system, with the optical elements 112, 115, 123, 124 and 132 formed thereon. The use of substrates having such planar regions may be advantageous, as tilt of all of the elements in the lens system may be controlled. The substrates having planar regions may also allow stacking of the elements and bonding directly to opposing planar regions, by which the optical elements may be aligned in along all three axes, which may facilitate wafer level assembly and may eliminate housing elements. The planar regions of the substrates may be in a periphery around each optical element and/or planar regions may be formed around the periphery of each optical element, e.g., through deposition of suitable material. Alternatively, the substrates may be secured at non-planar securing regions, e.g., using an adhesive to fill grooves within standoffs, as disclosed, for example, in commonly assigned U.S. Pat. No. 6,096,155. These securing regions may still be on surfaces on which the optical elements are formed.

Since the camera is designed to have no active focus adjustment, between the optical elements having power therein, e.g., separations S12 and S23, may be precisely controlled. In some cases, e.g., for separation S12, a thin spacing may be desired. In other cases, e.g., for separation S23, a larger spacing may be needed. In both cases, separations that provide accurate control of the distance between the optical elements in the z-direction, i.e., along the optical axis, and that seal the optical elements to protect them, e.g., from particles, debris and other environmental factors, may be desired. It also may be advantageous to place the separation S12 and S23 outside of the optical path for at least two reasons. First, having light travel through air may aid in shortening the overall length of the camera. Second, if the separations are outside the lens apertures, opaque material may be used, allowing the separations to also serve as baffles.

Depending on an amount of separation desired, the separations S12, S23 may be realized through lithographic techniques or through the use of a separate wafer. Lithographic techniques that can be used include, e.g., depositing and patterning material, or etching of the optical elements into the planar substrate such that a periphery thereof extends above the vertex of the optical element. If a material is deposited and patterned, a material that is opaque or absorptive, e.g., a metal or an absorptive polymer, may be used. Polymers, e.g. SU-8, that can be patterned lithographically to controlled thicknesses, e.g., about 50-100 microns, may be used. However, since such polymers may be transmissive, in order to further serve as a baffle, the polymer may be coated with an opaque material or may be dyed to become absorptive itself. Such standoffs may be formed as disclosed, for example, in commonly assigned U.S. Pat. Nos. 5,912,872 and 6,096,155, or such a spacer wafer may be formed as disclosed, for example, in commonly assigned U.S. Pat. No. 6,669,803, all of which are hereby incorporated by reference. Additionally, standoffs may be realized by providing a layer, e.g., an adhesive layer, over a surface to be secured and punching out appropriate passages in the layer to provide the needed optical path there through.

Further, an initial separation S01 of opaque and/or absorptive material, e.g., metal, may be provided on a top surface of the optics stack 140, e.g., on the same surface as the first refractive surface 112. The initial separation S01 may also serve as the main aperture stop. The initial separation S01 may be formed lithographically on the first substrate's 110.

Some minimal air gap, sufficient to allow some air gap between opposing optical surfaces, i.e., between a vertex of a refractive surface or a diffractive surface and an opposing substrate surface, e.g., a minimum on the order of about 5-10 microns, may help insure proper functioning of respective optical elements. Additionally, larger air gaps may be provided to allow for a more compact design, since light may refract at larger angles in air than in the substrates. Also, if providing lens systems having different focal lengths for different optical effects, as noted above, different air gaps may be provided for the different lens systems.

In the particular embodiment shown in FIG. 1C, the separation S23 is larger than the separation S12, allowing the image to fill the detector array 24, and both S12 and S23 are larger than a separation between the final substrate 130 and the detector array 24, which may have no air gap therebetween. By providing a larger air gap between an initial refractive surface and a final refractive surface, while minimizing any gap between the optics stack 140 and the detector array 24 in accordance with embodiments of the present invention, the camera may be made thinner than a conventional approach requiring spacing between the optical system and the sensors. The separations S01, S12 and S23 may be formed in different manners and of different materials.

Note that the largest air gap in FIGS. 1A to 1C occurs prior to the final refractive surface 132, but after the initial refractive surface 112. In conventional camera designs, the largest air gap typically occurs between the last optical element and the sensor. There are several reasons why this embodiment is different in this respect. First, having as large an air gap as possible within the camera may minimize the thickness of the camera. In general light travels at larger angles in air than within a substrate, so the thickness is minimized when air gaps are larger. However, room is also needed for the substrates to hold the elements, and where air gaps are located may aid to both minimize thickness and maximize performance.

In addition, a clear aperture of at least one of the refractive surfaces, and possibly clear apertures of all refractive surfaces, may be smaller than an active area of the detector array 24. Reducing the clear aperture of each lens element allows reduction in the SAG of each refractive surface. Generally, the smaller the SAG of each refractive surface, the easier and less expensive it may be to fabricate, especially if etched into a wafer. In general the smaller the diameter of refractive surface, the smaller the SAG. Keeping refractive surface diameters as small as possible may be achieved by keeping a beam diameter smaller than the active array of the detector array 24, until the very last surface.

This last surface may be used to simultaneously increase the diameter of the beam and to flatten the field. When a field flattener is used in this manner, the field flattener may have a diameter that is intermediate to that of the entrance pupil and that of the sensor. In addition, in this embodiment the entrance pupil may be located on the first refractive convex surface 112, so that the clear aperture of the first refractive convex surface 112 is equal to that of the entrance pupil. Thus, the clear aperture of the field flattener may be intermediate to that of the first refractive surface 112 and the active area of the detector array 24.

Thus, a smaller diameter refractive surface may be located at or near the entrance pupil, and clear apertures of all optical elements may expand as light travels from the entrance pupil to the active area of the detector array 24. The final refractive surface may have a diameter intermediate to that of the first refractive surface 112 and that of the active area of the detector array 24.

When designing a camera, in order to keep the diameters, and, therefore, the SAGs, of the first and second refractive surfaces 112 and 124 low, the third refractive surface 132 may be concave to both serve as a field flattener and to increase the size of the field. When such a field flattener is used, a large air gap may be needed prior to the third refractive surface 132.

As noted above, sensor dies may typically be larger than the optics dies. This size differential may further diverge in a camera system design as discussed above in which lenses having smaller lens diameters than a diagonal of the active areas of the detectors are used. In other words, the lenses have a different pitch than the detectors. For any such designs, and as yields become more critical in manufacturing camera systems, securing all elements at a wafer level, including the substrate having the detector thereon, may not be the most economical manner in which to manufacture these camera systems.

Figures 1D, 1E:
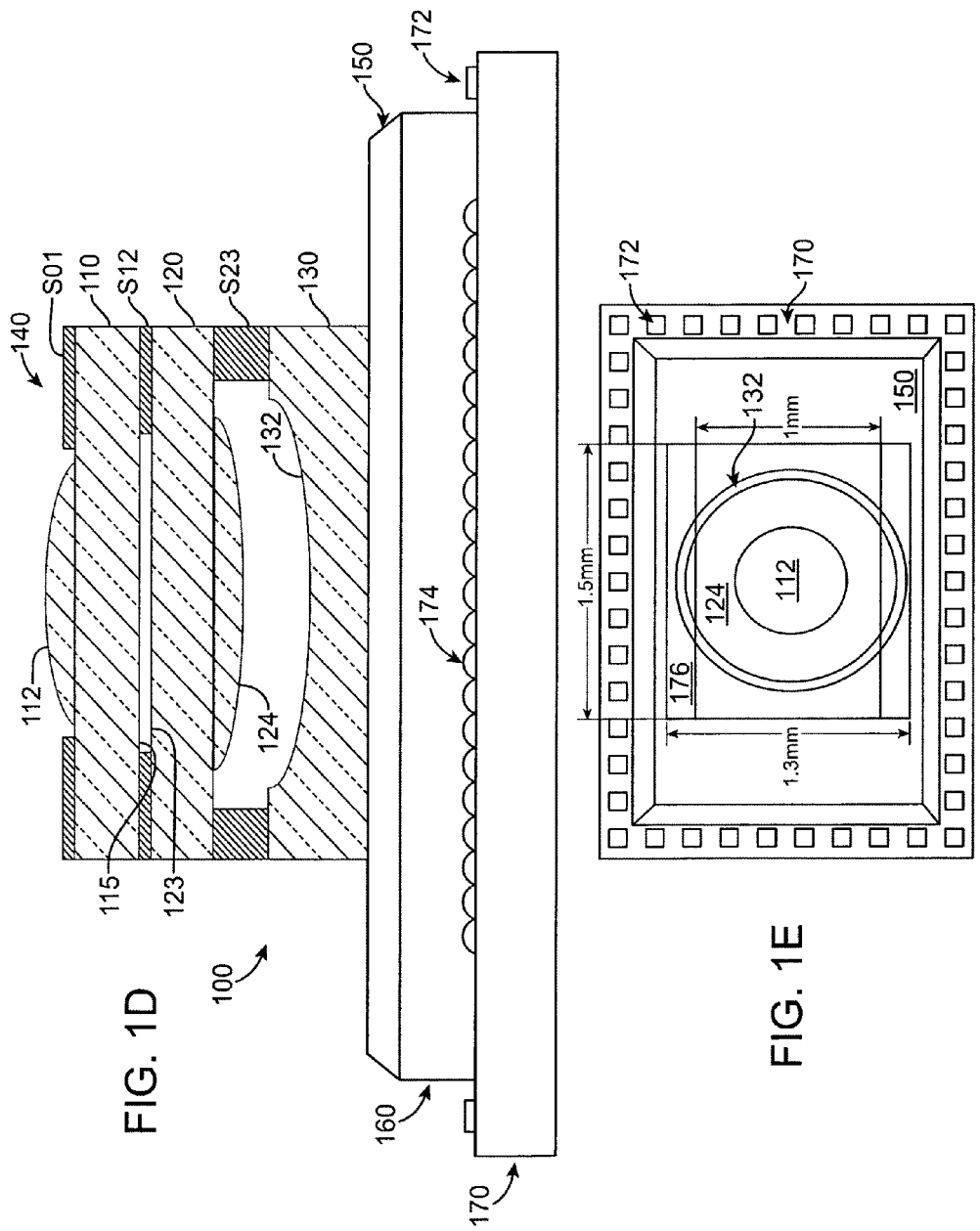
FIG. 1D illustrates a cross-sectional view of a camera system including the optics stack of FIG. 1C.
FIG. 1E illustrates a top view of the camera system of FIG. 1D.

A camera system 100 in accordance with an embodiment of the present invention is shown in FIGS. 1D and 1E. In addition to the optics stack 140, the camera system 100 may include a cover plate 150, a standoff 160, and a detector substrate 170. The detector substrate 170 may include an active area 176, an array of microlenses 174 and bond pads 172.

The standoff 160 may provide accurate spacing between the optics stack 140 and the detector substrate 170. The cover plate 150 and the standoff 160 may seal the active area 176.

While the standoff 160 is illustrated as being a separate element from the detector substrate 170 and the cover plate 150, the standoff may be integral with either one or both of the detector substrate 170 and the cover plate 150. Further, while sidewalls of the standoff 160 are shown as being straight, e.g., formed by dicing or patterning, they may be angled in accordance with how the standoff 160 is formed, e.g., at an etch angle of a particular material used for the standoff 160. In another implementation, the standoff 160 may be an adhesive material that is precisely provided on one or both of the detector substrate 170 and the cover plate 150, e.g., as disclosed in commonly assigned U.S. Pat. No. 6,669,803, which is herein incorporated by reference.

While the cover plate 150 is illustrated as having beveled edges, this may be an artifact of a process used to create the cover plate 150, and may vary in accordance with different processes. For example, when elements below a surface to be diced are to be protected, e.g., the dicing is not to occur through all secured wafers, an angled dicing blade may be employed. Further, the cover plate 150 may be transparent to light to be recorded by the camera system 100, e.g., may be glass.

As a result of the smaller diameters discussed above, as can be seen in both FIGS. 1D and 1E, the optics stack 140 may be smaller than the detector substrate 170. In the particular example illustrated in FIG. 1E, the optics stack 140 is 1.3 mm by 1.5 mm, the active area 176 is 1.0 mm by 1.5 mm, and the detector substrate 170 is 2.0 mm by 3.0 mm. The increasing diameters of the refractive surfaces 112, 124 and 132 may also be seen, and all of these diameters may be smaller than a diagonal of the active area 176.

This difference in dimensions means that many more optics stacks 140 may be formed than detector substrates 170 from a same size wafer. Thus, by forming and singulating the optics stack 140 before securing the optics stack 140 to the detector substrate 170, manufacturing costs may be reduced. In particular, optics stack 140 yields do not need to be as high, since only good optics stacks 140 will be secured to detector substrates 170. Further, more optics stacks 140 may be created from the same material than if securing the optics stack and the detector on a wafer level.

Figure 2A:
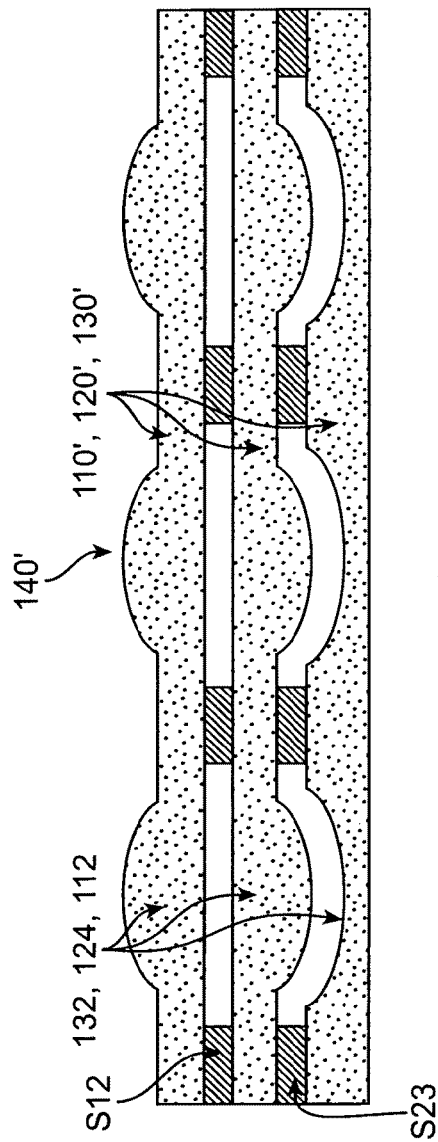
FIGS. 2A and 2B illustrate cross-sectional views in stages of a method of manufacturing optical stacks of FIG. 1D in accordance with an embodiment of the present invention.
Figure 2B:
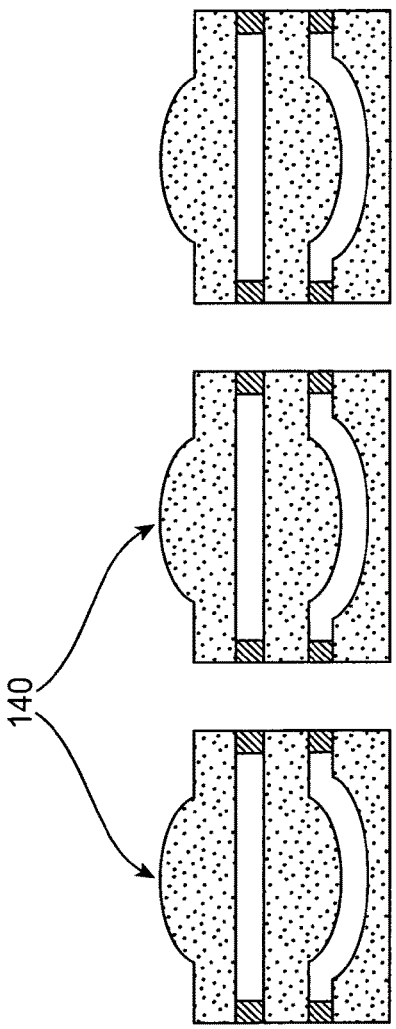

Stages in a method of manufacturing the optics stacks 140 are illustrated in FIGS. 2A and 2B. As can be seen therein, an optics stack wafer 140' may include a first wafer 110' of first substrates 110 with corresponding refractive surfaces 112, a second wafer 120' of second substrates 120 with corresponding refractive surfaces 124 thereon, and a third wafer 130' of third substrates 130 with corresponding refractive surfaces 132 thereon. The first and second wafers 110', 120' may be secured by corresponding separations S12, and the second and third wafers 120', 130', may be secured by corresponding separations S23.

After the first through third wafers 110', 120', 130' have been aligned and secured, as shown in FIG. 2A, they may be separated vertically, e.g., by dicing, etching, etc., to form the individual optics stacks 140, as illustrated in FIG. 2B.

As illustrated in FIGS. 3A and 3B, the individual optics stacks 140 may be aligned and secured to a cover wafer 150', which, in turn, may be secured to a detector wafer 170' via corresponding standoffs 160. After the individual optics stacks 140 have been aligned and secured to the cover wafer 150', as shown in FIG. 3A, the detector wafer 170' and the cover wafer 150' may be separated vertically, e.g., by dicing, etching, etc., to form the individual camera systems 100. As illustrated in FIG. 3B, this vertical separating may be performed using different techniques for the cover wafer 150' and the detector wafer 170'. In the particular example shown in FIG. 3B, the cover wafer 150' may be separated by dicing from an upper surface thereof, and the detector wafer 170' may be separated by dicing from a lower surface thereof, as described, for example, in commonly assigned U.S. Pat. No. 7,208,771: which is hereby incorporated by reference. The separating may expose the contact pads 172.

A camera system 200 according to another embodiment of the present invention is illustrated in FIGS. 4A to 6B. In this embodiment, a cover optic substrate 230 having a final refractive surface 232, e.g., a concave refractive surface, may be used in place of the cover plate 150, thereby eliminating an element. However, the use of such a cover optic substrate as a cover structure in place of a simple cover plate may require tighter alignment between the cover optic substrate 230 and the optics stack 240. Further, it may be difficult to test the acceptability of the optics stack 240 before securing it to the detector substrate 170, since an element will be missing from the optical system.

Figure 4A:
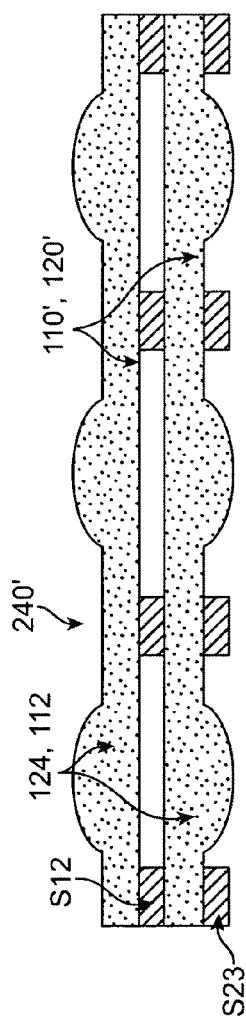
FIGS. 4A and 4B illustrate cross-sectional views in stages of a method of manufacturing optical stacks in accordance with another embodiment of the present invention.
Figure 4B:
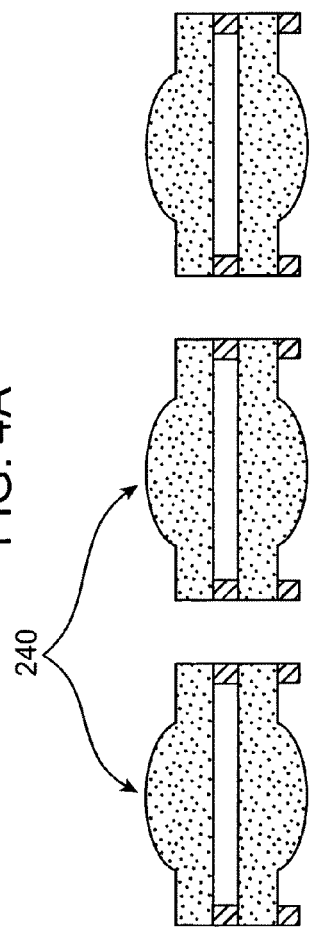

Stages in a method of manufacturing optics stacks 240 are illustrated in FIGS. 4A and 4B. As can be seen therein, an optics stack wafer 240' may include a first wafer 110' of first substrates 110 with corresponding lenses 112, and a second wafer 120' of second substrates 120 with corresponding lenses 124. The first and second wafers 110', 120' may be secured by corresponding separations S12. Corresponding separations S23 may be provided on a bottom surface of the second wafer 120'.

After the first and second wafers 110', 120' have been aligned and secured, as shown in FIG. 4A, they may be separated vertically, e.g., by dicing, etching, etc., to form the individual optics stacks 240, as illustrated in FIG. 4B.

Figure 5:
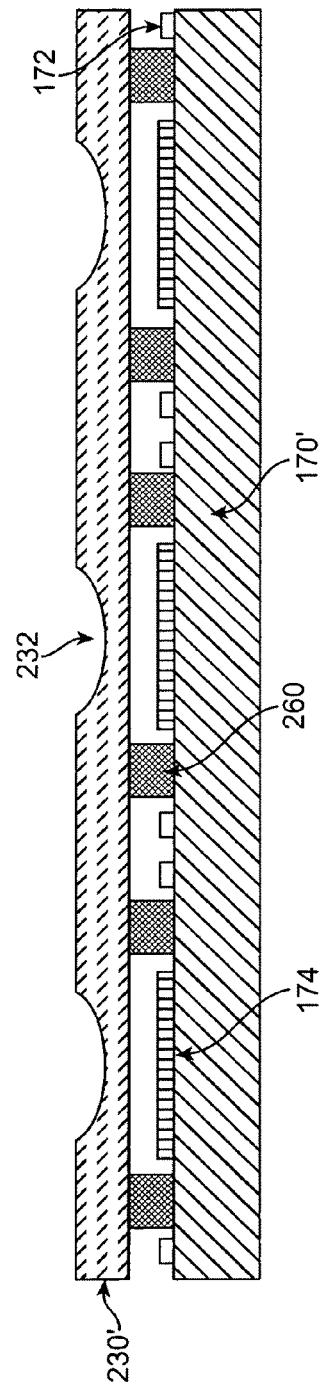
FIG. 5 illustrates a cross-sectional view of a sensor substrate and a optics substrate including concave elements secured at a wafer level.

FIG. 5 illustrates a cross-section of a optic cover wafer 230' secured via corresponding standoffs 260 to the detector wafer 170'. The concave refractive lenses may be formed before or after the optic cover wafer 230' is secured with the detector wafer 170'. Further, the separations S23 may be formed on the optic cover wafer 230' instead of, or in addition to, the optics stack 240.

As illustrated in FIGS. 6A and 6B, the individual optics stacks 240 may be aligned and secured to the optics cover wafer 230', which, in turn, has been secured to the detector wafer 170' via corresponding standoffs 260. After the individual optics stacks 240 have been aligned and secured to the optics cover wafer 230', as shown in FIG. 6A, they may be separated vertically, e.g., by dicing, etching, etc., to form the individual camera systems 200. As illustrated in FIG. 6B, this vertical separating may be performed using different techniques or process steps for the optics cover wafer 230' and the detector wafer 170'. In the particular example shown in FIG. 6B, the optics cover wafer 230' may be separated into the optics cover substrates 230 by dicing from an upper surface thereof, and the detector wafer 170' may be separated into the detector substrates 170 by dicing from a lower surface thereof. The separating of the optics cover substrates 230 may affect, e.g., partially remove, the standoffs 260. The separating may expose the bond pads 172.

Figure 7A:
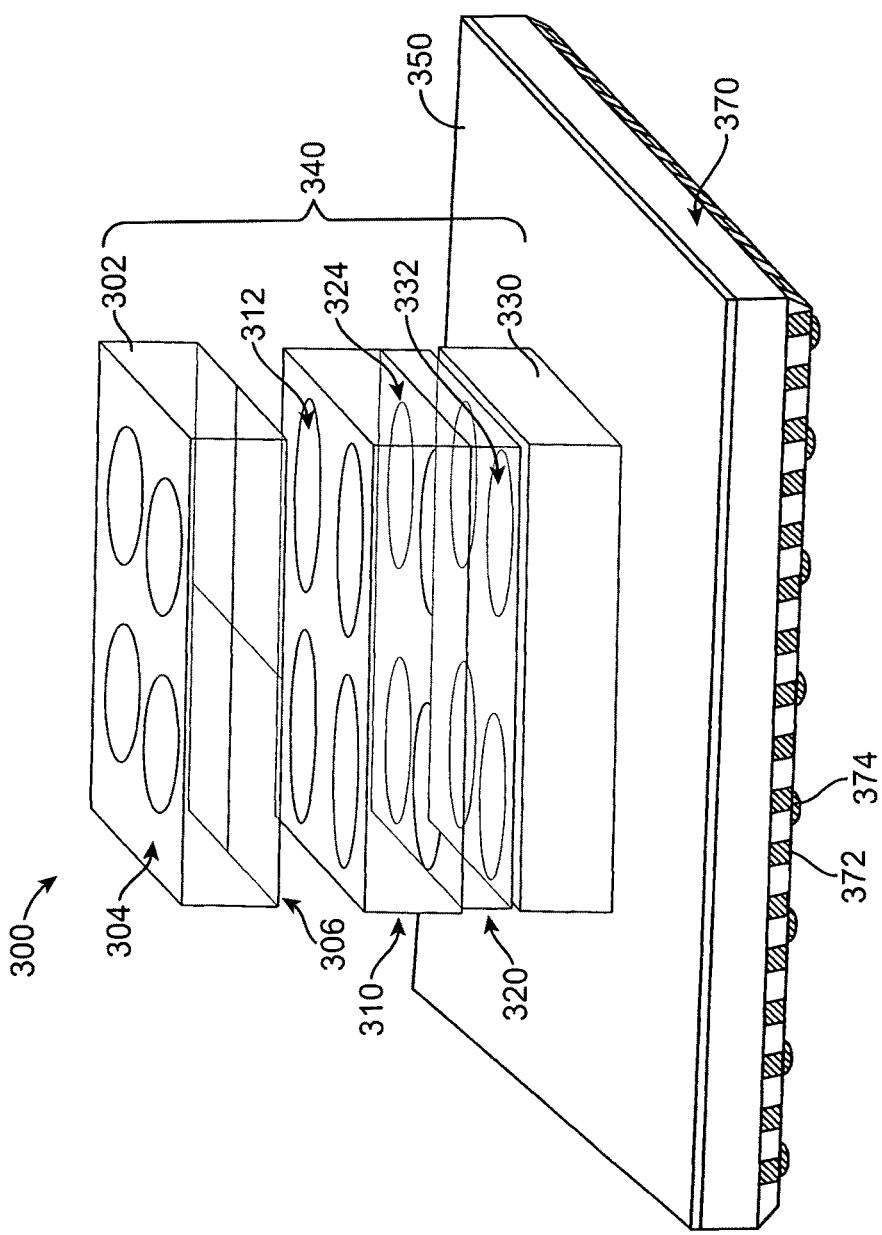
FIG. 7A illustrates an exploded schematic perspective view of a camera system in accordance with another embodiment of the present invention.

As shown in FIG. 7A, a camera system 300 according to another embodiment of the present invention may include four sub-cameras. The camera system 300 may include an optics stack 340, a cover plate 350 and a detector substrate 370.

The optics stack 340 may include a filter substrate 302, a first substrate 310, a second substrate 320, and a third substrate 330. The filter substrate 302 may include an array of lenses 304 on a first surface of the filter substrate 302 and an array of color filters 306 on a second surface of the filter substrate 302. The first substrate 310 may have an array of first refractive surfaces 312. The second substrate 320 may include an array of second refractive surfaces 324. The third substrate 330 may include an array of third refractive surfaces 332.

Each sub-camera may include a color filter 306 and first through third refractive surfaces 312, 314 and 323. The color filters 306 may include a red filter, a green filter, and a blue filter, one for each of three of the sub-camera. A fourth filter may be green or may be completely transparent, and the sub-imager may provide a different focal length than the other three sub-cameras. Alternatively, no individual color filter may be associated with a lens, e.g., a fourth lens in a four sub-camera configuration, which may instead provide a Bayer pattern and a lens having a different focal length than the remaining lens systems in the ILA, e.g., a telephoto lens, a wide angle lens, a macro lens, a fisheye lens, etc., in order for different optical effects to be realized. Further, each lens system may provide a different focal length and be associated with a Bayer pattern to realize full color.

Again, the optics stack 340 may be smaller than the detector substrate 370, and either of the above methods for manufacturing the camera system 300 discussed above may be employed. Here, the diameters of the lenses for each sub-camera may be smaller than a diagonal of a corresponding active area on which that sub-camera is to provide an image.

Further, as illustrated in FIG. 7A, the cover plate 350 and the detector substrate 370 may be coextensive, and the detector substrate 370 may include electrical interconnections 372 wrapping around an edge thereof and conductive structures 374 to electrically connect the active area of the detector substrate 370 to a circuit board. Alternatively, the active area may be connected by the conductive structures through conductive vias on a bottom surface of the detector substrate 370, e.g., as disclosed in commonly assigned U.S. Pat. No. 7,224,856, which is hereby incorporated by reference.

Figure 7B:
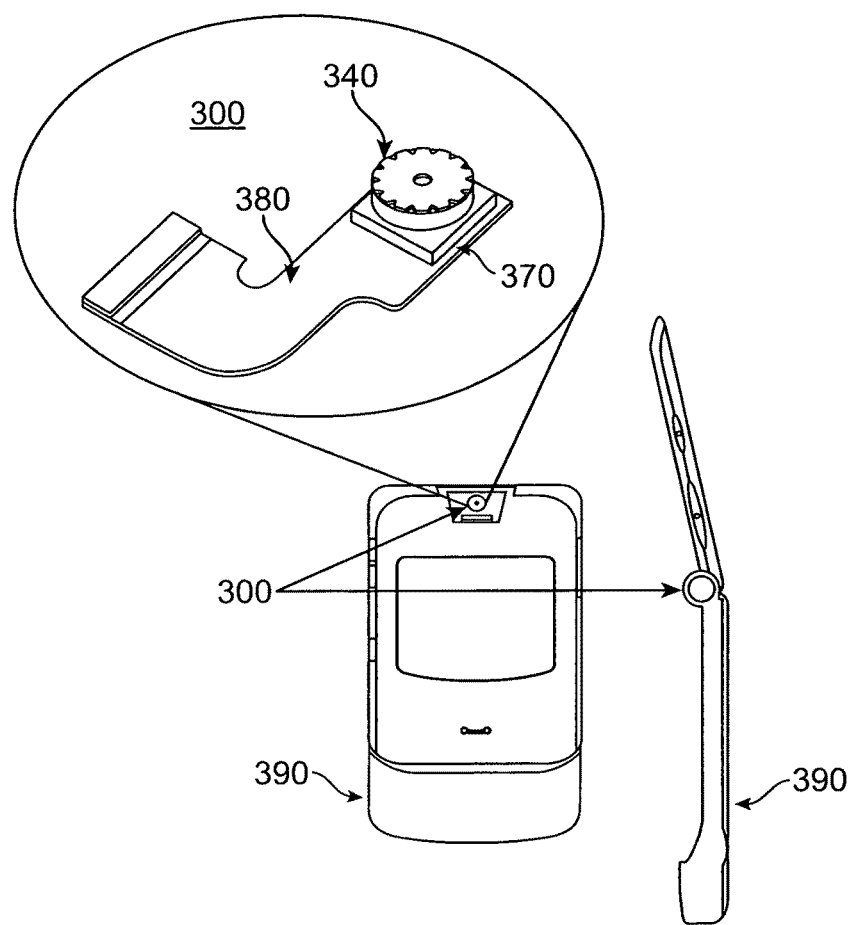
FIG. 7B illustrates a view of a camera system of FIG. 7A incorporated in a portable device.

All of the elements forming the imaging system in accordance with embodiments may be able to withstand thermal conditions needed to secure the conductive structures 374 to a circuit board 380, as illustrated in FIG. 7B. For example, when the conductive structures 374 are solder, all of the elements forming the imaging system may be able to withstand conditions for solder reflow. Thus, the detector 370 with the optics stack 340 in accordance with embodiments of the present invention may be surface mounted on the circuit board 380, e.g., by reflowing solder. In particular, since a plastic housing is no longer needed and all optical elements may be formed in replication material or glass, the imaging system may be less susceptible to conditions encountered when surface mounting the camera.

As further illustrated in FIG. 7B, the circuit board 380 may be for incorporation into a portable device, e.g., a cellular phone. As can be seen from the side view of FIG. 7B, the camera system 300 may be the thickest component of the portable device.

Figure 8A:
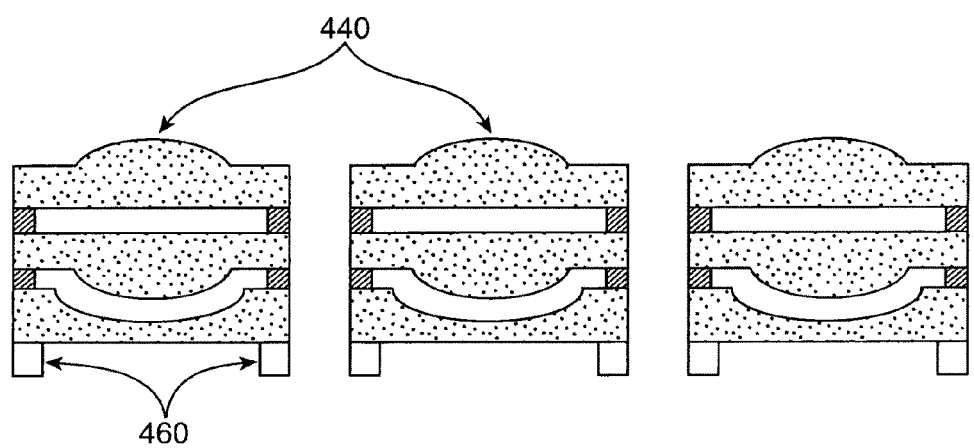
FIGS. 8A and 8B illustrate cross-sectional views in stages of a method of manufacturing a camera system in accordance with another embodiment of the present invention.
Figure 8B:
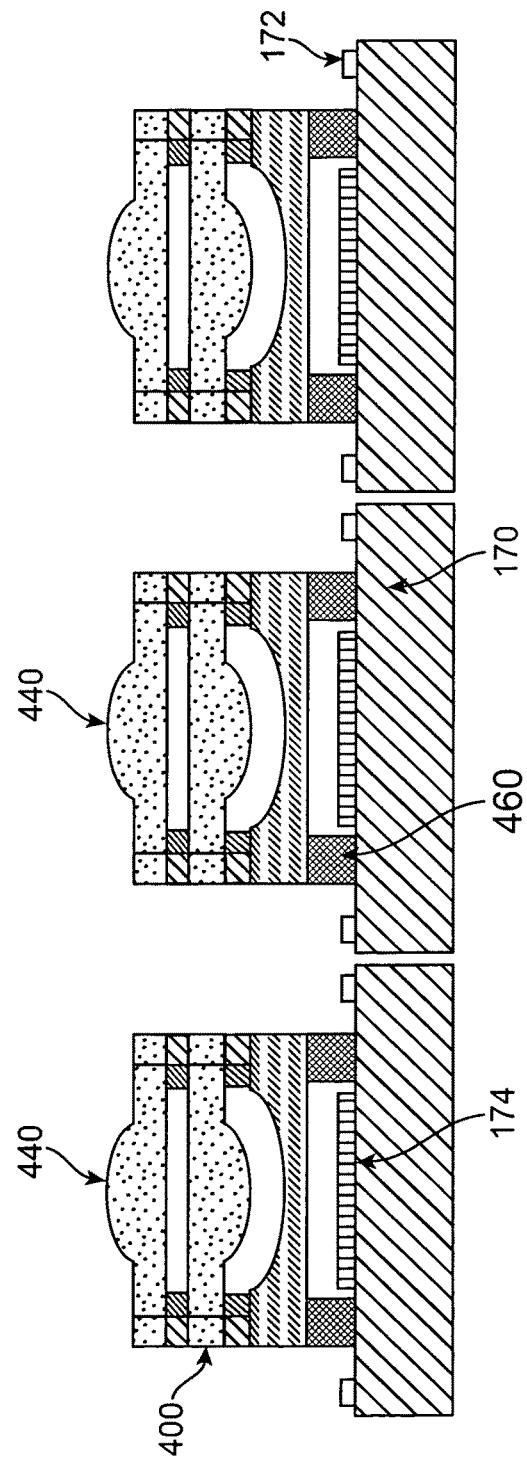

Another alternative embodiment is illustrated in FIGS. 8A and 8B. As shown therein, an optics stack 440 may have a same structure as shown in FIG. 6B, although in this embodiment, the substrates having the lenses are now extended to a same size as the optic cover plate substrate 230, which may now be integrated with the optics stack on a wafer level. Note that since the entire secured stack is to be separated, the optic cover plate substrate may have a straight edge.

In particular, while the lens diameters may remain the same as in FIG. 6B, the optics stack 440 may have dimensions of, e.g., 1.8 mm by 2.0 mm. Thus, while the optics stack 240 may be approximately ⅓ the area of the detector substrate 170, even increasing the size of the optics stack by 0.5 mm renders the optics stack 440 still less than ⅔ the size of the detector substrate 170. In general, if an area of the optics stack is less than 20% of the detector substrate, it may be advantageous to secure and singulate the optics stack before securing it to the detector wafer. This may also allow yields to be increased, since only acceptable optics stacks may be secured to acceptable detectors.

As further shown in FIG. 8A, standoffs 460 may be formed on a wafer level with the optics stack 440. The standoffs 460 may be any of the standoff variations noted above. Further, while all substrates in the optics stack 440 are illustrated as being coextensive, the optics stack may include the lens substrates of FIG. 6B secured on a wafer level with an optics cover plate wafer, and then separated to have the optics cover plate substrate extend beyond the other lens substrates, e.g., as shown in FIG. 6B, with either straight or beveled edges.

As shown in FIG. 8B, after the individual optics stacks 440 have been aligned and secured to the detector wafer 170', this structure may be separated vertically, e.g., by dicing, etching, etc., to form the individual camera systems 400. Further, since only the active area 176 of the detector substrate 170 need to be protected, standoffs 460 may be closer to the active area 176, thus increasing available usable exposed area, e.g., for bonding, integrating additional circuitry, etc. As shown in FIGS. 8A and 8B, the standoff 460 may be made on a wafer level with the optics stack 440, but these standoffs 460 may alternatively provided on the detector substrate 170. Any of the above designs may be made in this fashion by sufficiently increasing a surface area, e.g., the horizontal cross section, of the optics stack, or at least the final substrate thereof.

Figure 9A:
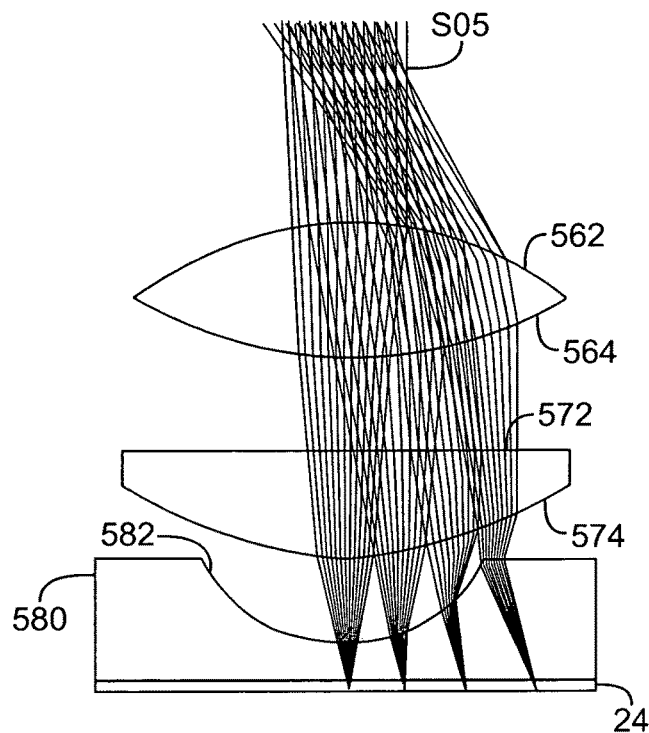
FIG. 9A illustrates a schematic side view of a camera system in accordance with another embodiment of the present invention.
Figure 9B:
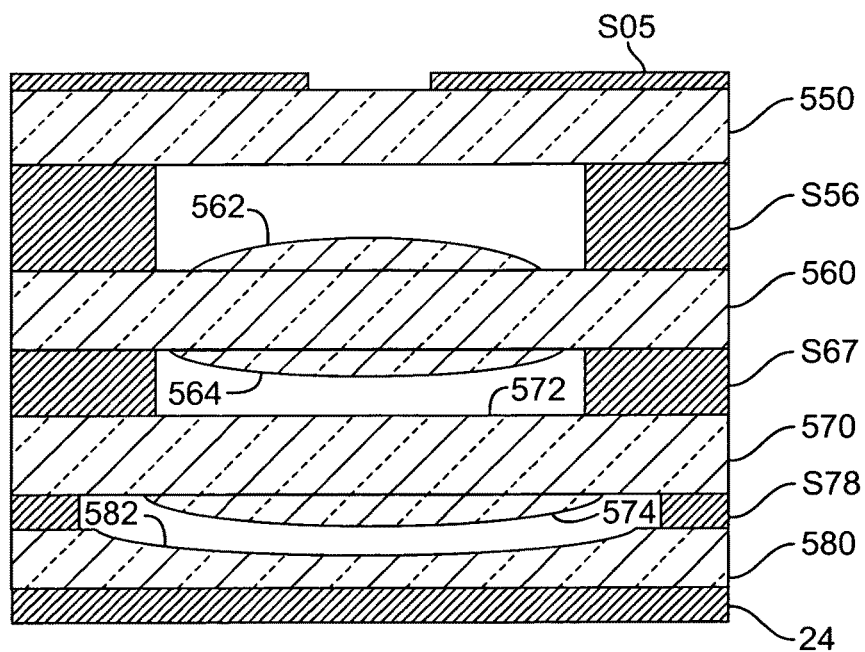
FIG. 9B illustrates a schematic cross-sectional view of the camera system of FIG. 9A.

Another example of an optics stack 540 is illustrated in FIGS. 9A and 9B. Again, a single lens system may be used for all colors or this single lens system may be one of a plurality of lens systems.

In FIG. 9A, different light paths correspond to different field points from the object. A first substrate 550 may have a main aperture stop S05 thereon, which may restrict the light input to the camera. The second substrate 560 may include a first refractive surface 562, which may assist in imaging the light input thereto. The second substrate 560 may include a second refractive surface 564 which may further assist in imaging the light. A diffractive element 572 may be on a third substrate 570, which may correct for color and imaging aberrations. The third substrate 570 may also have a third refractive surface 574, which may further assist in imaging the light. A final substrate 580 may have a fourth refractive surface 582 therein. The fourth refractive surface 582 may be concave and may flatten the field of the image, so that all image points are imaged at the same plane to be imaged onto the detector array 24.

As can be seen most clearly in FIG. 9B, separations S56, S67 and S78, between opposing substrates may be different. In the particular configuration shown in FIGS. 9A and 9B, the largest separation S56 is between the main aperture stop S05 and the first refractive surface 562, although, in other embodiments, the largest separation could be located elsewhere, e.g., separation S67.

Figure 10:
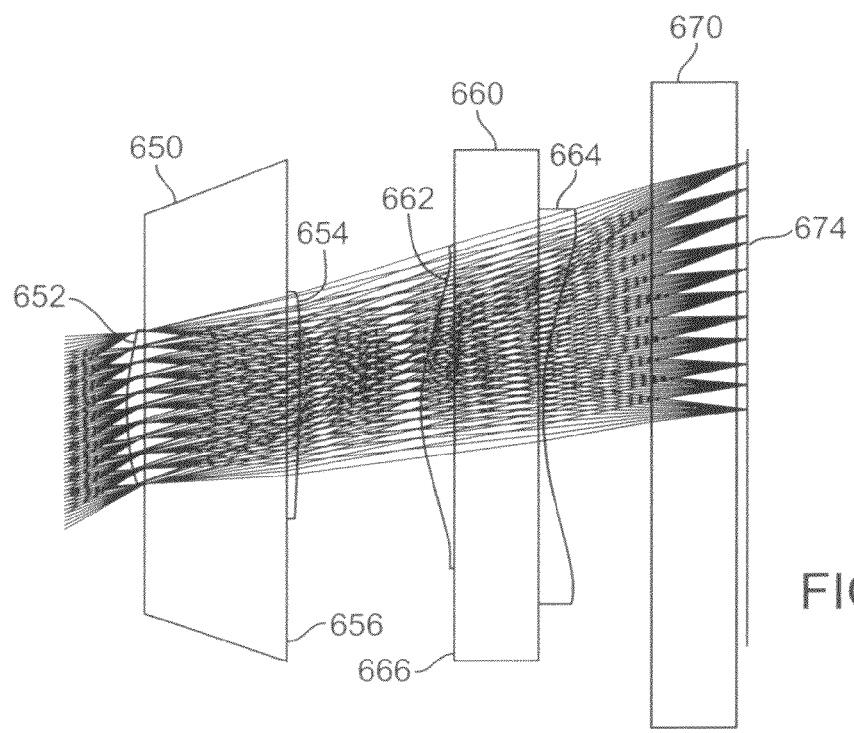
FIG. 10 illustrates a schematic side view of a camera system in accordance with another embodiment of the present invention.

Another example embodiment of an imaging system is illustrated in FIG. 10. As shown therein, the imaging system may include a lens stack formed of a first substrate 650 and a second substrate 660. The imaging system may be spaced apart from and attached to a cover plate 670 covering an active area 674 of a detector.

The first substrate 650 may include a first refractive element 652 on a first surface and a second refractive element 654 on a second surface, parallel to the first surface. As illustrated in FIG. 10, the side surfaces of the first substrate 650 may not be parallel with one another, according to how the optics stacks are singulated through the surfaces on which the optical elements are formed.

The second substrate 660 may include a third refractive element 662 on a first surface, facing the second surface of the first substrate 650, and a fourth refractive element 664 on a second surface, parallel to the first surface. As shown in FIG. 10, the radii of curvature may vary across the refractive elements 662, 664.

The first and second substrates 650, 660 may be secured together on a wafer level using securing regions 656, 666 on opposing surfaces thereof. Various techniques discussed above for providing accurate separation between the substrates may be used, e.g., stand-offs, punched adhesive, spacer wafers, etc. As discussed above, the optics stack may be secured to the cover 670 on a wafer level or on a die level. Here, even though the optics stack is to be spaced from the cover 670, using any of the spacing techniques noted above, an air gap between the first and second substrates 650, 660 may be greater than an air gap between the optics stack, here the second surface of the second substrate 660, and the cover 670.

Figure 11:
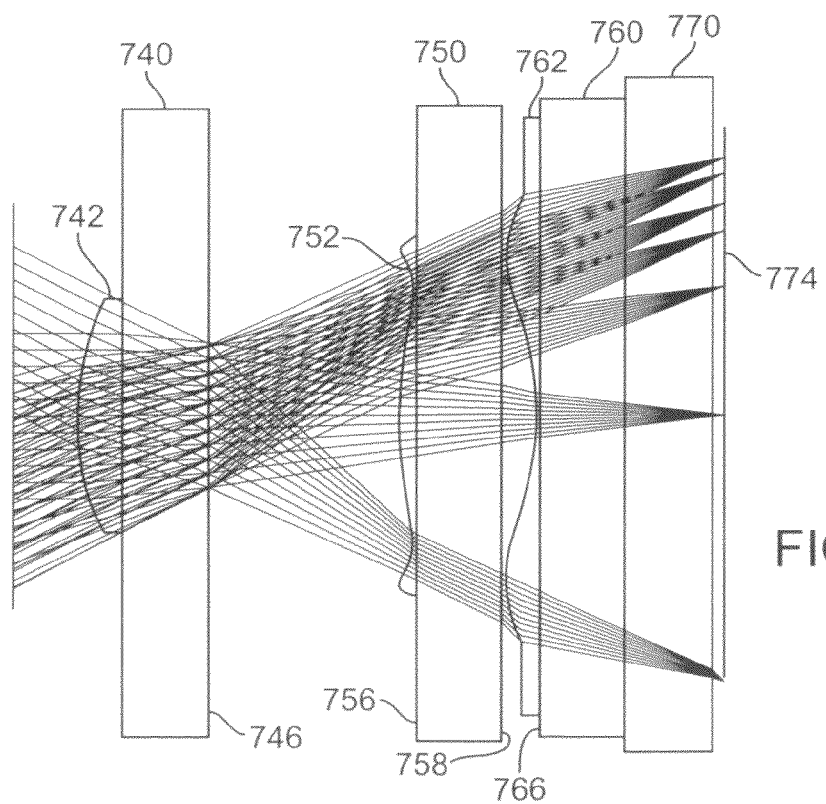
FIG. 11 illustrates a schematic side view of a camera system in accordance with another embodiment of the present invention.

Another example embodiment of an imaging system is illustrated in FIG. 11. As shown therein, the imaging system may include a lens stack formed of a first substrate 740, a second substrate 750 and a third substrate 760. The imaging system may be attached directly to a cover plate 770 covering an active area 774 of a detector.

The first substrate 740 may include a first refractive element 742 on a first surface and no elements in the optical path on a second surface, parallel to the first surface. The second substrate 750 may include a second refractive element 752 on a first surface, facing the second surface of the first substrate 740, and no elements in the optical path on a second surface, parallel to the first surface. The third substrate 760 may include a third refractive element 762 on a first surface, facing the second surface of the second substrate 750, and no elements in the optical path on a second surface, parallel to the first surface. The second surface of the third substrate 760 may be planar and may be directly secured to the cover plate 770.

As shown in FIG. 11, the radii of curvature may vary across the refractive elements 752, 762. For example, the second refractive element 752 may include a central convex region having a first radius of curvature and a peripheral concave region having a varying radius of curvature. The third refractive element may include a central concave region having a second radius of curvature and a peripheral convex region having a third radius of curvature.

The first, second and third substrates 740, 750, and 760 may be secured together on a wafer level using securing regions 746, 756, 758 and 766 on respective opposing surfaces thereof. Various techniques discussed above for providing accurate separation between the substrates may be used, e.g., stand-offs, punched adhesive, spacer wafers, etc. As discussed above, the optics stack may be secured to the cover 770 on a wafer level or on a die level.

Thus, in accordance with embodiments of the present invention, a camera system may be realized by using optical elements created on a wafer level, which may be secured using planar surfaces thereof. Various mechanisms for providing separation between these optical elements may be used. Baffles, which may include the separation mechanisms, may be provided throughout the optical assembly. These separation mechanisms may also seal and protect the optical elements of the optical assembly. The final planar surface of the optical system may be placed directly on the detector array, i.e., on top of the detector microlens array or the detector cover plate. Diffractive elements and other corrective elements may be used to correct for variations from a desired optical functioning, e.g., focal length variation or aberrations. Lenses having different focal lengths may be provided in an array of camera systems, to provide further optical functioning.

Some embodiments of the present invention may use an array of lens systems for each camera system, e.g., a lens system for each color to be imaged by the optical system. Other embodiments of the present invention may use a single lens system for each camera system. Using a lens system for each color may allow each lens to be optimized for a particular associated wavelength range, may be thinner and may allow the color filter to be placed within the optical system, i.e., after a top surface and before the detector array. However, using the plurality of lens systems for each camera system may increase end signal processing to combine resultant images. Using a single lens system may fit a more conventional approach, reducing post processing, but may not be made as thin, and may require the color filter array to remain in the detector array.

The creation of passive optical elements in wafer form and securing these passive optical elements with other passive optical elements or with electro-optical elements at a wafer or die level, and using the wafers and/or adhesive material securing the wafer to seal elements therebetween is well known, as disclosed in commonly assigned U.S. Pat. Nos. 5,912,872 and 6,096,155. As disclosed therein, the substrates may be secured on planar surfaces thereof, and may be secured by providing adhesive materials, e.g., epoxy, solder, UV cured adhesives, thermally cured adhesives, etc., or may fuse adjoining substrates. As further disclosed in these patents, kinematic features may be formed lithographically to aid in mating and aligning substrates. If an optical element is to be formed on a surface that remains exposed after wafer level securing, e.g., an upper surface of the first substrate 110, the optics cover plate 230 or the filter substrate 302, they may be formed after securing.

As also disclosed in these patents, the creation of passive optical elements may be performed lithographically or a master may be made, e.g., by molding, lithography, machining, etc., and passive optical elements may be replicated from this master, either of which may be referred to herein as "lithographs." Further, a replicated lithograph may be transferred into a substrate, as disclosed, for example, in U.S. Pat. No. 6,027,595, which is incorporated by reference herein. The method and material used to make these passive optical elements may be determined by the design of the passive optical elements. For example, if a refractive optical element having a large sag is required, replication may be advantageous, as direct lithographic techniques may require a lot of time to create such a lens, since an etch time is directly proportional to the sag.

There are a limited number of transparent materials that are suitable for direct lithography, e.g., glass, e.g., fused silica. Unfortunately, many materials suitable for direct lithography may have similar indices of refraction and dispersion. This makes it very difficult to design a high quality camera system, i.e., one with high MTF across the entire field, using wafer-level fabricated optical components. In particular, chromatic aberrations may be a particular source resulting in decreased MTF. One solution to this issue is to use a diffractive element to reduce the chromatic aberrations. In addition, the wavelength range of each lens system can be narrowed, i.e., using different colors for each lens system, the chromatic aberrations are further reduced. Another potential solution is to use plastic materials, e.g., polymers, for some of the lens surfaces, e.g., when a replicated lithograph is the final element. These plastic materials may typically be cheaper and lighter than glass, but may have a higher coefficient of thermal expansion and may have a higher dispersion than glass.

However, by using materials having different chromatic dispersion characteristics, e.g., a high dispersion material and a low dispersion material, a higher MTF may be realized compared to using one material alone. For example, replicated elements may be made of a polymer and lithographic elements may be made of glass. These materials may have different coefficients of thermal expansion, different indices of refraction, and different chromatic dispersion characteristics. By constructing a system using both polymer optical elements and glass optical elements, a higher MTF may be realized compared to using one material alone. Thus, a system may be created using direct lithography for some optical elements, e.g., a first refractive, which may have the smallest diameter, and replication for other optical elements. Of course, all elements may be replicas or directly formed.

At least two of the first substrate, the second substrate, the final substrate and the detector array may be created and secured on a wafer level, i.e., a plurality of these elements may be created and secured together, and then singulated to form the stack shown, for example, in FIGS. 2B, 6B, 7 or 8A. Such wafer level creation may be realized in accordance with the teachings of commonly assigned U.S. Pat. Nos. 6,451,150 and 6,483,627, which are incorporated by reference herein in their entirety. Further, all of the optical elements may be created on a wafer level, even if only secured on a die level.

Components of the camera systems may be secured and singulated, and then secured to other components which have also been previously secured and singulated with other components. Alternatively, instead of singulating the camera systems, an array of these camera systems providing different optical effects, e.g., different focal lengths, may be provided by the different camera systems. For example, a two by two array of camera systems, one having a standard lens configuration, another having a wide angle lens, another having a telephoto lens, and another having a macro lens, may be formed.

As discussed in detail above, in designing a camera system, it is advantageous to have large air gaps at some point between the first lens and the sensor. However, when wafer based optics are used, it is also advantageous to fabricate the optical elements on substrates that have a thickness large enough to support the elements across the entire wafer. This limits the locations in which large air gaps can be placed. That is, if a large air gap is placed between two elements, in many cases, that may be the only place a large air gap can be used while still fitting all the substrates and elements needed for the camera system within the thin space constraint. In other words, in designing a camera system, only one large air gap may be available. Therefore, the location of the large air gap or the largest air gap between any two elements may be a critical design parameter.

In conventional camera system design, the largest air gap is typically placed between the last lens surface and the sensor. This is often done because it is difficult to place a lens element directly on or close to the sensor plane. As noted above, with a wafer scale camera system, this constraint is removed. Optical surfaces can be easily located near the sensor plane as described above. Placing a field flattener near the sensor plane may allow the bulk of the camera optics, e.g., elements 112, 124 in FIG. 1A, to have a smaller apertures, and, thus, smaller diameters and SAGs, and perform their camera function with higher field curvature and more demagnification, which, in turn, may be corrected by the field flattener, which both expands the field and flattens it. Thus, having the largest air gap between any two components located between two optical element surfaces, as opposed to between the last lens element surface and the sensor, may result in a more easily manufacturable design for a wafer scale camera system. The largest gap may be located between the last lens surface prior to the field flattener and the field flattener, as shown, for example, in FIGS. 1A and 6B.

Further, the provision of a cover structure which extends beyond the optics stack in accordance with embodiments of the present invention may allow the cover structure to serve as a mount for other elements of the camera system, e.g., a light blocking material may be provided on the cover structure surrounding the optics stack to reduce stray light.

Finally, while a particular lens system for a camera system has been illustrated, the above principle may be employed for any lens system design for which optics substrates are small relative to a detector substrate sufficiently increase a number of lens systems that may be made on a wafer relative to a number of detectors.

Embodiments of the present invention have been disclosed herein and, although specific terms are employed, they are used and are to be interpreted in a generic and descriptive sense only and not for purpose of limitation. For example, while conventional three color components have been illustrated throughout, any appropriate three or more color components for realizing full color camera may be employed. Further, while circular lenses have been illustrated for the sub-imager design, other shapes allowing higher packing densities for a higher fill factor, such as hexagonal lenses, may be used. Additionally, while different apertures have been described for providing different images in the sub-cameras having the same color, other optical elements that provide a difference may be used. For example, the active areas of the pixels themselves may be shaped differently for the different sub-cameras. Any of the electrical I/O solutions may be used with any of the embodiments. Accordingly, it will be understood by those of ordinary skill in the art that various changes in form and details may be made without departing from the spirit and scope of the present invention as set forth in the following claims.

What is claimed is:

1. A camera system, comprising:
an optics stack including two substrates, the optics stack forming an imaging system, each substrate having two surfaces that are parallel to each other and perpendicular to an optical axis of the imaging system, each opposing surface of the two substrates in the optics stack including a securing region at which the two substrates are to be secured to one another, the two substrates being secured together on a wafer level at their respective securing regions, a first surface of the two substrates including a first refractive surface of the imaging system and a second surface of the two substrates including a second refractive surface of the imaging system;
a third refractive surface;
a detector substrate having a light sensing area; and
a cover structure protecting at least the light sensing area of the detector substrate, the optics stack being secured to an upper surface of the cover structure, a diameter of the first and second refractive surfaces in the optics stack being smaller than a diagonal of the light sensing area corresponding to the imaging system, wherein a diameter of the third refractive surface, which is a closest refractive surface to the light sensing area, is larger than diameters of other refractive surfaces in the optics stack and the third refractive surface is a concave surface.

2. The camera system as claimed in claim 1, wherein at least one substrate in the optics stack has a smaller surface area than an upper surface area of the cover structure.

3. The camera system as claimed in claim 1, wherein the two substrates and the cover structure are secured at a wafer level.

4. The camera system as claimed in claim 1, wherein the two substrates are co-extensive.

5. The camera system as claimed in claim 1, wherein the cover structure includes a final optical element.

6. The camera system as claimed in claim 1, further comprising a final optical element between the optics stack and the cover structure.

7. The camera system as claimed in claim 1, wherein the cover structure and the detector substrate are secured on a wafer level.

8. The camera system as claimed in claim 1, wherein the cover structure and the optics stack are secured on a wafer level.

9. The camera system as claimed in claim 1, wherein the camera system includes a plurality of sub-cameras, each having a corresponding refractive surface on a same surface of the optics stack.

10. The camera system as claimed in claim 1, further comprising a spacer structure directly contacting the securing regions of opposing surfaces.

11. The camera system as claimed in claim 1, wherein the spacer structure is an adhesive.

12. The camera system as claimed in claim 1, further comprising conductive features on a bottom surface of the detector substrate adapted to surface mount the detector substrate on which the optics stack has been secured.

13. The camera system as claimed in claim 12, further comprising electrical interconnections wrapping around edges of the detector substrate from the light sensing area to the conductive features.

14. The camera system as claimed in claim 12, further comprising a circuit board on which the detector substrate on which the optics stack has been secured is surface mounted, the conductive features being soldered to the circuit board.

15. The camera system as claimed in claim 12, wherein the conductive features are solder.

16. The camera system as claimed in claim 1, wherein the at least one surface of the two surfaces has more than one refractive surface thereon and a planar region between adjacent refractive surfaces.

17. The camera system as claimed in claim 1, wherein the securing regions are planar.

18. The camera as claimed in claim 1, wherein the optics stack includes a third surface including the third refractive surface.

19. The camera as claimed in claim 1, further comprising a third substrate including the third surface.

20. The camera as claimed in claim 19, wherein the third substrate has a larger surface area than the first and second substrates.

21. The camera as claimed in claim 19, wherein the third substrate serves as the cover plate.

\* \* \* \* \*